United States Patent [19]

Edwards et al.

[11] Patent Number: 5,992,159
[45] Date of Patent: Nov. 30, 1999

[54] METHOD AND APPARATUS FOR HEAT EXTRACTION BY CONTROLLED SPRAY COOLING

[76] Inventors: Christopher Francis Edwards, 5492 Lenore Ave.; Ellen Meeks, 304 Daisyfield Dr.; Robert Kee, 864 Lucille St.; Kevin McCarty, 304 Daisyfield Dr., all of Livermore, Alameda County, Calif. 94550

[21] Appl. No.: 08/709,496

[22] Filed: Sep. 6, 1996

Related U.S. Application Data

[63] Continuation of application No. 08/450,748, May 25, 1995, abandoned.

[51] Int. Cl.⁶ ....................................................... F25D 17/02
[52] U.S. Cl. ................................ 62/64; 62/74; 134/14; 266/259
[58] Field of Search ........................... 62/64, 74; 134/14; 266/259

[56] References Cited

U.S. PATENT DOCUMENTS

| | | | |
|---|---|---|---|
| 3,339,373 | 9/1967 | Mobius et al. | 62/64 |
| 3,693,352 | 9/1972 | Hinze et al. | 62/64 |
| 4,110,092 | 8/1978 | Kunioka et al. | 62/64 |
| 4,136,527 | 1/1979 | Kading | 62/64 |
| 5,025,632 | 6/1991 | Spritzer | 62/64 |
| 5,146,759 | 9/1992 | Eguchi et al. | 62/64 |
| 5,220,804 | 6/1993 | Tilton et al. | 62/64 |

OTHER PUBLICATIONS

Hoogendoorn et al. Proceedings of the Fifth International Heat Transfer Conference, vol. 4, Sep. 3–7, 1974. (Tokoyo) "Leidenfrost Temperature and Heat–Transfer Coefficients for Water Sprays Impinging on a Hot Surface" pp. 135–138.

Schermer et al. Diamond and Related Materials, vol. 2 (1993) p. 1149–115 "Controlled Deposition of Diamond From an Acetylene–Oxygen Combustion Flame".

Pais M.R. et al. 27th Aerospace Sciences Metting, Jan. 9–12, 1989 (Nevada) AIAA–89–0241 "High–Heat–Fulx. Low–Superheat Evaporative Spray Cooling" pp. 1–11.

Choi et al. International Journal of Heat Transfer, vol. 30, No. 2 (1987) "Mechanics of Film Boiling Heat Transfer of Normally Impacting Spray" pp. 311–318.

Shamanian et al. "Thermal Management Considerations Involved in the Design of a Substrate Mount for Large Area CVD Diamond Combustion Deposition" pp. 1–27.

*Primary Examiner*—Ronald Capossela
*Attorney, Agent, or Firm*—Kurt Olsen; Timothy Evans

[57] ABSTRACT

Two solutions to the problem of cooling a high temperature, high heat flux surface using controlled spray cooling are presented for use on a mandrel. In the first embodiment, spray cooling is used to provide a varying isothermal boundary layer on the side portions of a mandrel by providing that the spray can be moved axially along the mandrel. In the second embodiment, a spray of coolant is directed to the lower temperature surface of the mandrel. By taking advantage of super-Leidenfrost cooling, the temperature of the high temperature surface of the mandrel can be controlled by varying the mass flux rate of coolant droplets. The invention has particular applicability to the field of diamond synthesis using chemical vapor deposition techniques.

39 Claims, 6 Drawing Sheets

| | d | T | Re | We | Exp. |
|---|---|---|---|---|---|
| ■ | 260 | 86 | 700 | 3.4 | K |
| ○ | 260 | 86 | 990 | 6.8 | K |
| ◆ | 260 | 86 | 1280 | 11 | K |
| ▲ | 250 | 26 | 540 | 12 | K |
| ▼ | 270 | 86 | 1380 | 13 | K |
| ■ | 310 | 25 | 820 | 24 | W-2 |
| ● | 105 | 25 | 560 | 33 | W-4 |
| ◆ | 105 | 25 | 830 | 74 | W-3 |
| ▲ | 303 | 25 | 1766 | 115 | W-1 |

METHOD AND APPARATUS FOR HEAT EXTRACTION BY CONTROLLED SPRAY COOLING

This application is a continuation of application number 08/450,748, filed May 25, 1995, now abandoned.

STATEMENT OF GOVERNMENT INTEREST

The Federal government has rights in this invention pursuant to contract no. DE-AC04-94AL8500 between the U.S. Department of Energy and Sandia Corporation.

FIELD OF THE INVENTION

The present invention relates generally to the problem of removing heat from a high temperature, high heat flux surface. More particularly, it relates to a method and an apparatus for using sprays of coolant droplets to cool a heated surface in a controlled manner.

BACKGROUND OF THE INVENTION

The controlled extraction of heat fluxes of order 1000 W/cm$^2$ remains a challenge in many fields, including steel processing, nuclear reactor safety, and high-temperature materials synthesis. The field of materials synthesis is of particular interest with respect to the production of diamond.

The commercial production of synthetic diamonds began in the 1950's with the development of pressure cells capable of achieving combinations of temperature and pressure of sufficient duration to turn common forms of carbon into diamond. Such pressure-based techniques have been refined over the years to the point where high pressure is the basis for the production of considerable quantities of diamond. Still, these techniques are very demanding of the equipment they employ, requiring sustained pressures of several millions of atmospheres to form diamond.

A somewhat contrary approach is known as Chemical Vapor Deposition (commonly abbreviated as CVD). This approach is based on the realization that diamonds can be formed in low-pressure conditions from a heated gas comprising isolated carbon-containing radicals. Under suitable conditions of temperature and with a proper substrate, these species can be made to deposit carbon in the form of a diamond film.

One of the technical problems attendant to practicing this technique lies in properly controlling the high temperatures of the substrate—generally, a mandrel surface—on which the diamond film forms. Briefly, in flame based diamond CVD, a premixed flame is created in a stagnation point flow against a surface on which diamond film growth is desired. The reactants—typically acetylene, hydrogen, and oxygen—create a high flame temperature of approximately 3000° K. It will be appreciated that the production of this flame is accompanied by high rates of heat and mass transport to the deposition surface (i.e., the substrate) of the mandrel. In other words, in CVD the flux of energetic molecular species to the surface is accompanied by a large flux of heat which must be removed from the mandrel if control of the growth process is to be maintained. For low-pressure (i.e., sub-atmospheric) flame CVD, the heat flux is sufficiently low that conventional methods of convective and/or radiative cooling may be use. At higher pressure, where diamond growth rates increase by an order of magnitude, heat fluxes of order (i.e., within a factor of ten of) 1000 W/cm$^2$ must be extracted.

The situation is further complicated by the need to hold the deposition surface temperature to a tight tolerance somewhere within the optimal diamond growth range (~1200° K), and the requirement that heat extraction be made in a one-dimensional fashion to preserve the uniform boundary condition on the flame. Additional problems that must be taken into consideration include compensating for the discontinuity of flux that arises at the boundary of the finite-area flame, providing for real time control and tuning of the heat extraction process, and compensating for process fluctuations. It would also be desirable to provide scalability to accommodate projected commercially sized mandrels (typically 6–8 inches in diameter).

The heat flux created by the flame must be removed from the mandrel if the temperature of the mandrel diamond deposition surface is to be maintained within acceptable limits for the rapid growth of high quality diamond film. Excessive deviation of the temperature of the substrate from the optimal level will result in a decline in the quality of the diamond film, a diminution in its growth rate, or both. Given the complexity of the combustion process that gives rise to the heat and mass flows, it is far preferable to control this heat directly at the mandrel by removing heat from the mandrel (and hence the deposition surface) than by attempting to modify the kinetics of the flame itself.

So-called pool-boiling has been employed to control mandrel temperature in a variety of applications. In pool boiling, a portion of a mandrel is submersed in water to provide heat extraction. Pool boiling provides efficient heat transfer via phase change of the coolant where the heat fluxes through the mandrel are moderately high and the temperature of the surface submerged in water exceeds the boiling point.

Unfortunately, the heat flux capabilities of pool boiling fall just short of those required for high heat flux applications such as diamond synthesis. This is because of the so-called critical heat flux or burn-out problem of boiling heat transfer. At sufficiently great levels of heat flux, the coolant immediately adjacent the hot surface boils so rapidly that a continuous vapor film is formed adjacent to the surface, which inhibits subsequent wetting of the surface, and impedes further heat transfer (the so-called Leidenfrost effect). Forced convective or pressurized boiling provide some extension of cooling capabilities to higher heat fluxes, but this is limited to less than an order of magnitude improvement. Both pool boiling and forced convective boiling are ultimately limited by the burnout phenomenon.

Dilute spray cooling has been employed to circumvent this problem by placing the cooling fluid on the surface in discrete quanta, i.e., droplets, separated by many diameters in space and surface-interaction periods in time. This precludes the possibility of forming a contiguous vapor film (and burnout), since only small portions of the surface are in contact with the water at any instant and only small, isolated regions of vapor are formed. Using spray cooling at low surface superheat temperatures, heat flux capacities in excess of 1000 W/cm$^2$ have been demonstrated in several studies, provided the temperature on the surface being sprayed remains fairly close to the boiling point of the water (and thus below the Leidenfrost temperature). This method of cooling has been studied extensively both out of theoretical interest and for the possibility of application to the electronics and the nuclear power industries.

Less attention has been paid to the problem of spray cooling at high surface superheat temperatures. This is due in large part because many processes cannot tolerate high surface temperatures, and also because onset of the Leidenfrost phenomenon (where the spray droplets no longer wet the surface) causes cooling effectiveness to decrease by an order of magnitude from the low superheat case.

One approach to providing a spray cooling solution to this problem calls for the heat extraction surface of the mandrel to be uniformly coated with a cooling spray with sufficient capacity to ensure that the surface remain near the saturation temperature of the coolant (generally water). This uniform surface temperature (or isothermal boundary condition) guarantees that the heat extraction is one-dimensional (given a one-dimensional heat input) and that sufficient heat extraction can be maintained over the required range of operating conditions without adjustment of the spray. Unfortunately, these desirable characteristics come at a price—inflexibility in control of the deposition surface temperature.

Since, in such an approach, the temperature of the cooling surface is generally fixed near the saturation condition by the phase change of the droplets, and the heat flux into the mandrel is imposed by the flames, the only way to achieve a desired deposition surface temperature has been by varying the thermal resistance of the mandrel itself. This has been accomplished by bolting together a series of disks to achieve the required temperature rise from the isothermal boundary to the deposition surface. Although this is a workable solution under some conditions, this approach suffers several drawbacks:

Any adjustment or change in flame conditions (i.e., imposed heat flux) requires a change in mandrel configuration to hold the temperature constant. The correct value of resistance must be determined by a series of trial and error experiments which are time consuming and expensive to accomplish. Also since these changes cannot be made on line, the available level of flexibility in control over the process is poor, and real-time control is impossible. Process fluctuations which cause the heat flux to vary (e.g., changing the reactant composition or flame/mandrel spacing) will cause the deposition surface temperature to deviate from the desired set point.

Since the cooling surface is isothermal, uniform temperature at the deposition surface will only result if the heat flux through the mandrel is uniform, that is, if the sides of the mandrel are effectively adiabatic and the flame is uniform over the mandrel surface. If either of these conditions is not met, the deposition surface temperature cannot be made uniform using this method.

This method precludes the provision of spatial profiling of the heat extraction from the mandrel. Variations of the heat flux profile into the mandrel cannot be compensated in this design.

These limitations could be overcome if it were possible to carry out the spray cooling process without being tied to the isothermal boundary condition inherent in phase-change cooling. In general, there remains a need for a means of controlling the temperature at the deposition side of a heated mandrel that avoids the problems present in known approaches to cooling a high heat flux surface. In particular, there remains a need for a cooling process that would:

1) permit the extraction of large heat fluxes from the mandrel, typically on the order of 1000 Watts/cm$^2$, and particularly in the range of 200–400 Watts/cm$^2$ (which is of interest in current commercial processes);

2) allow for control over the deposition surface temperature of the mandrel independently of any variations which may arise in the flame itself;

3) provide a spatially uniform surface temperature across the face of the mandrel, where such is desired; and 4) be scalable to allow cooling of mandrels larger than those that are currently being used (e.g., mandrels having a substrate area as large as those employed in the semiconductor industry, where diamond films may find significant application).

SUMMARY OF THE INVENTION

The present invention provides two solutions to this problem. In a first embodiment, spray nozzles are circumferentially arranged about the sides of a mandrel on an assembly that is moveable with respect to the mandrel. This permits the spatial variation of the isothermal cooling surface defined by the coolant spray droplets, which alters the overall thermal resistivity of the mandrel and with it, the temperature at the hot side of the mandrel.

A second embodiment, in common with the first approach, also utilizes a spray of coolant to control the temperature of the mandrel. However, in this embodiment, the Leidenfrost effect—an effect which generally has been viewed as an impediment—is employed to advantage to provide for the controlled cooling of a hot surface. It has been observed that when a hot surface is above the Leidenfrost temperature, the quantity of heat that an impinging spray of coolant is capable of removing from the surface varies in a monotonic, well behaved manner (within bounds) as a function of the coolant mass flux rate. This permits one to "dial in" the heat flux to be removed from the surface by choosing an appropriate droplet mass flux rate. In addition to permitting the cooling of a high temperature, high heat flux surface, this approach permits the creation of spatial temperature gradients along the hot side by employing an appropriate spatial arrangement of spray nozzles, and varying the mass flux rate of coolant through the nozzles as desired.

BRIEF DESCRIPTION OF THE DRAWINGS

For a more complete understanding of this invention, reference should now be made to the embodiments illustrated in greater detail in the accompanying drawings and described below. In the drawings.

DETAILED DESCRIPTION

Figure 1:
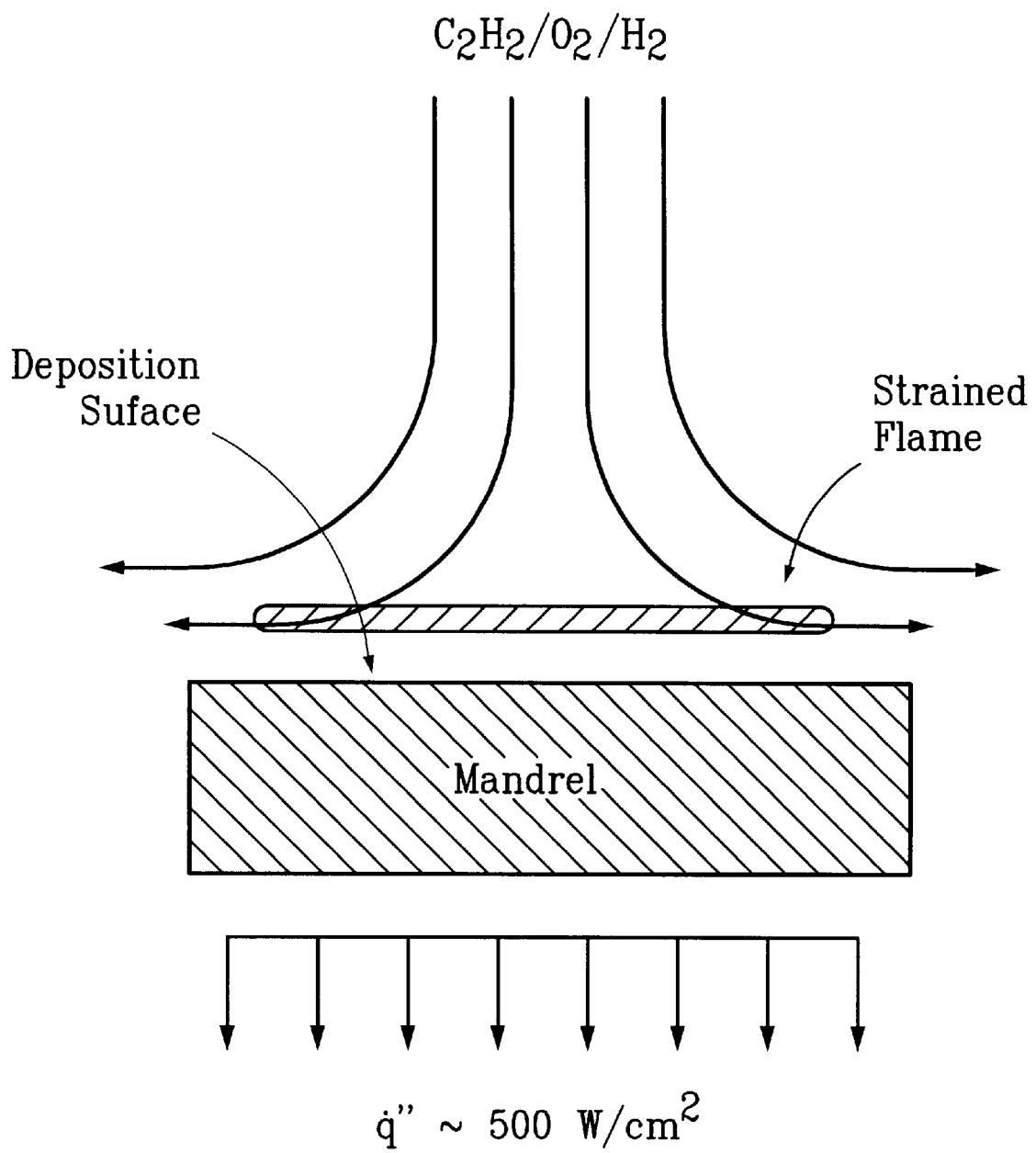
FIG. 1 schematically illustrates a known chemical vapor deposition (CVD) process for growing a diamond film on the deposition surface of a mandrel.

Referring now to the drawings, wherein like numerals indicate like parts throughout, the growth of diamond films by flame chemical vapor deposition (CVD) is illustrated in FIG. 1. A high velocity jet of premixed $C_2H_2/O_2/H_2$ is formed into a stagnation point flow over the surface of a molybdenum mandrel 10, causing the formation of a highly strained flame immediately adjacent to the surface. Due to the nature of the flow field, the flame is inherently flat and acts as the source of a one-dimensional flux of heat and species to the adjacent surface. By tailoring both the gas-phase and mandrel-surface characteristics (including its temperature), controlled deposition of carbon with $sp^3$ bonding (diamond) may be achieved uniformly over the mandrel surface.

Figure 2:
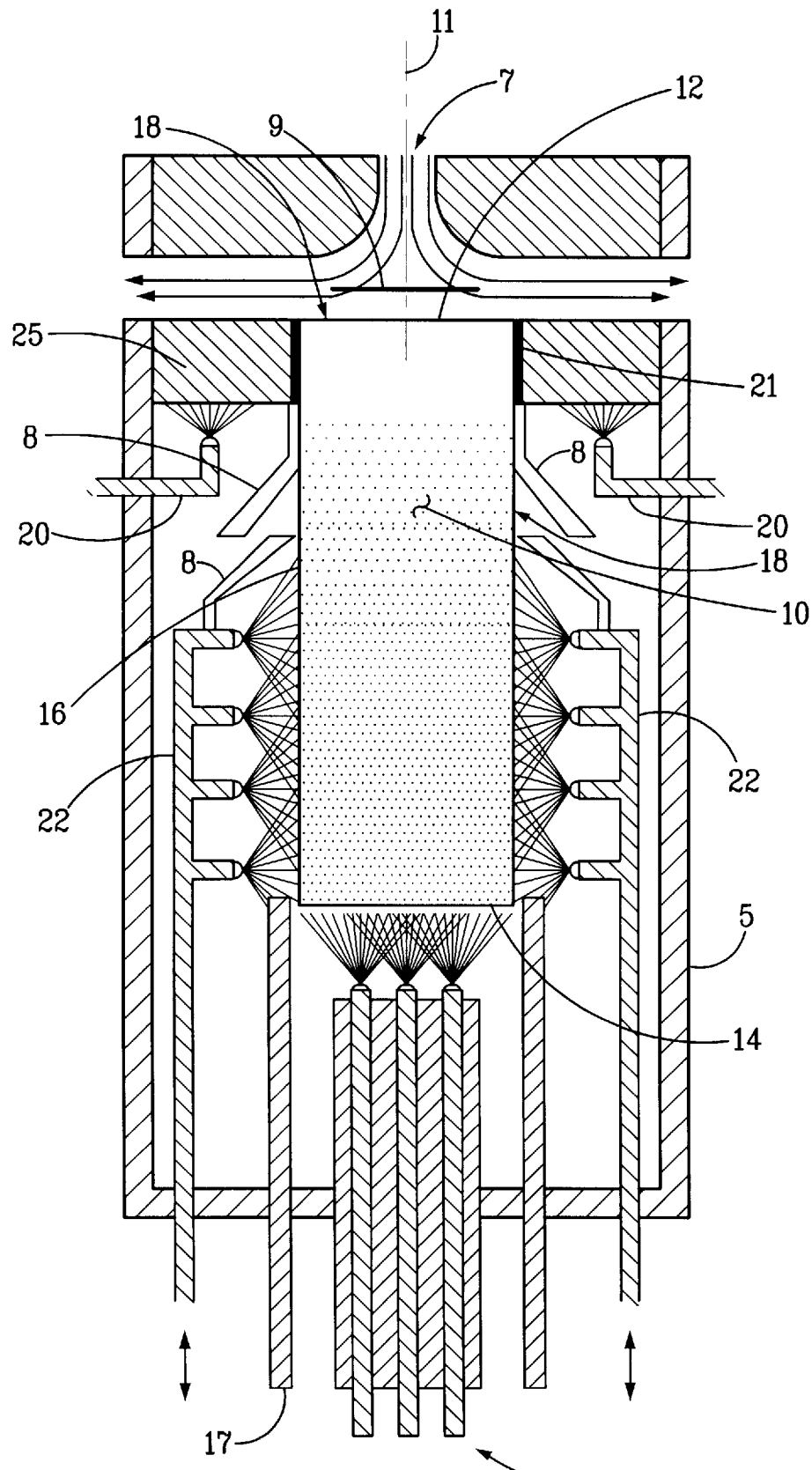
FIG. 2 illustrates a first embodiment of an apparatus utilizing spray cooling constructed according to principles of the invention, in which a movable spray assembly is utilized to provide variable boundary isothermal spray cooling.

FIG. 2 illustrates a first embodiment constructed according to the principles of the invention, which provides variable boundary condition isothermal spray cooling. This embodiment makes use of isothermal spray cooling in a manner in which the thermal resistance of the mandrel can be altered in real time. It is based on the realization that an effective way to vary the thermal resistance of a mandrel is to move the location of the isothermal cooling boundary axially along the mandrel surface to vary the overall resistance of the mandrel.

Referring again to FIG. 2, a mandrel 10 is constructed of a rod of molybdenum. A flame 9 impinges on the top face of the mandrel 10, which acts as the deposition surface 12 (the hot side of the mandrel). On the bottom face 14 (the cool side of the mandrel) a fixed, uniform, isothermal spray cooling pattern is applied via a set of cooling nozzles 24 that are bundled together in a support tube 17 (which also acts as a splash guard). The term "nozzle" is meant to encompass any known structure suitable for use in delivering a flow of droplets. In this embodiment, in addition to the quantity of heat that is extracted from the bottom of the mandrel 10, heat is also extracted from the mandrel in a radial manner as follows. Arrayed circumferentially around the peripheral surface 16 of the mandrel 10, a set of moveable side nozzles 22 provides a ring of spray jets to create an isothermal boundary condition, the location of which can be varied by moving the nozzles 22 parallel to the axis 11 of the mandrel 10. (In a alternative embodiment, the nozzles may be fixed and the mandrel moved with respect to the nozzles. In yet another embodiment, control over the location of the isothermal boundary may be obtained by varying the angle of the nozzles in a controlled manner.) The side nozzles 22 may be moved in the axial direction 11 by any known actuator mechanism capable of providing controlled translatory motion, such as a hydraulic/pneumatic unit, solenoid, etc. Axially moving the spray nozzles 22 closer to the hot end 12 of the mandrel 10 decreases the thermal resistance of the mandrel 10; moving the sprays towards the cool side 14 of the mandrel increases the resistance of the mandrel 10.

The spray provided by the lower nozzles 24 at the bottom of the molybdenum mandrel 10 ensures that even if the side nozzles 22 are lowered past the end 14 of the mandrel, some portion of the surface of the molybdenum will be maintained close to the coolant boiling point so that efficient heat transfer can occur and catastrophic failure of the mandrel 10 be avoided. Similarly, outer cooling nozzles 20 are provided to direct sprays of coolant to a deck 25 (which is spaced from the mandrel 10 by a thermal break 21) adjacent the hot side substrate 12 to prevent it from melting, as well as to help further control the flame structure. Splash guards 8 are provided adjacent the spray jets to provide an additional level of control over the areas to which the coolant is applied.

This method is adjustable on line and is amenable to real time control of the deposition surface temperature in the presence of process fluctuations. For example, by instrumenting the mandrel with thermal sensors 18 (optical pyrometers can be used for this purpose as well), a computer/controller can be fed information with which to effect the movement of the nozzles. For example, a computer based process controller can utilize information regarding the thermal state of the mandrel to look up in a table a suitable position for the nozzles with respect to the mandrel, and direct the actuator to adjust the position of the side nozzles 22 accordingly. Also, standard proportional-integral-derivative control algorithms may be employed to control the temperature, with the sensors providing suitable feedback. An additional layer of control may also be provided by permitting variations in the flow rate of coolant through either one or both of the side or bottom nozzles, as well as by providing control over the atomization characteristics of the nozzles. (This can readily be accomplished in a number of ways, such as through the use of conventional air-assisted atomizers.)

A fixed degree of spatial profiling may be provided by contouring the rod to control the shape of the thermal flux lines near the deposition surface.

Figure 3:
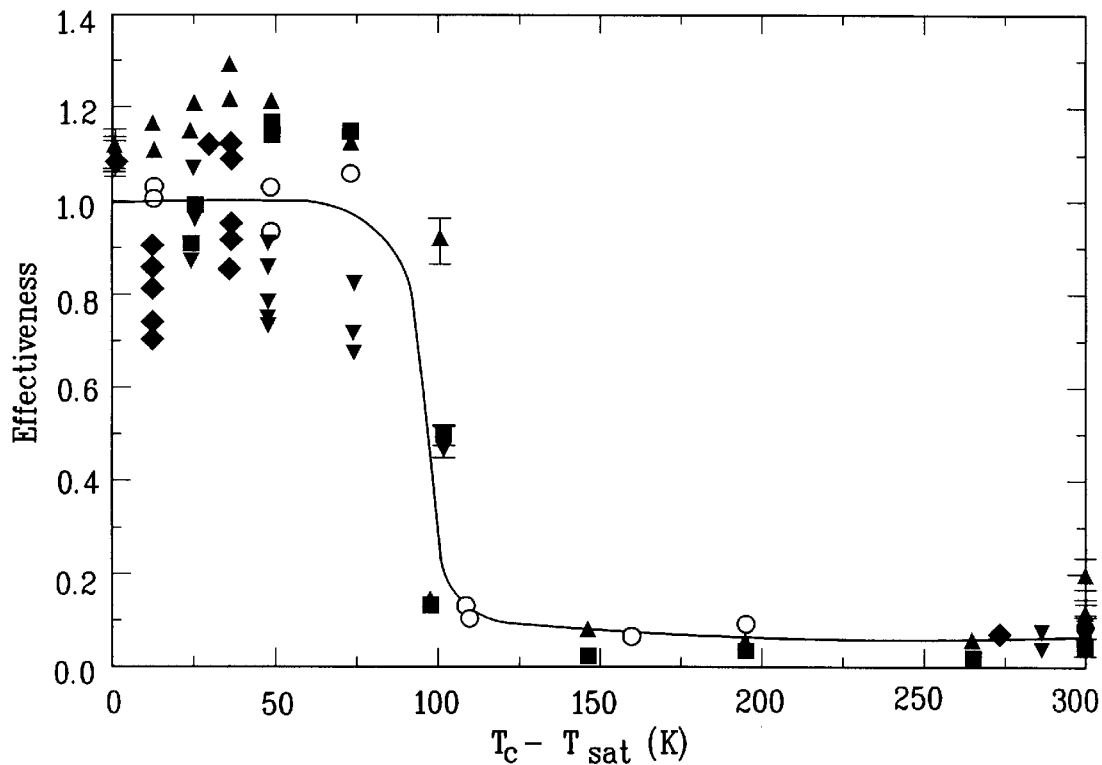
FIG. 3 is a graph of single-droplet heat transfer effectiveness data (presented in the doctoral dissertation of J. Naber)

A second embodiment of the invention employs super-Leidenfrost spray cooling. Any consideration of the potential for such spray cooling begins with a consideration of the heat transfer effectiveness of individual droplets. Naber [7] provides a comprehensive review of single-droplet heat transfer studies to date, while Pedersen [8] reports a series of measurements in the super-Leidenfrost region. FIG. 3 presents a summary of Naber's data for water, in which cooling effectiveness is defined as the ratio of the actual heat extracted by a droplet impinging on a hot surface to the theoretical maximum extraction (liquid sensible heat plus latent heat plus vapor sensible heat up to the surface temperature). In FIG. 3, the effectiveness is plotted as a function of surface superheat temperature (rise above saturation). Although there is some scatter in the data, it is apparent that at low surface superheat temperatures, the heat extracted is close to the theoretical limit. However, past some threshold temperature, the efficiency drops precipitously to a level an order of magnitude lower before leveling off again. This precipitous drop is due to the onset of the Leidenfrost phenomenon—the droplet no longer wets the surface and boils but instead rebounds from the surface without apparent phase change.

The data in FIG. 3 include droplet diameters from 100 to 300 $\mu$m and velocities from 1 to 7 m/s. Studies varying these characteristics show that the effectiveness does not vary with droplet size, but velocity can be a significant factor. Pedersen's data, for example, shows the effectiveness to be proportional to velocity over the range of values investigated (3–10 m/s).

These data illustrate the attractiveness of low-superheat (isothermal) spray cooing for high heat flux processes. With single-droplet effectiveness near unity, significant cooling can be accomplished using relatively dilute sprays which preclude surface flooding and therefore burnout. Of course if the spray flux is too dense, the surface will become flooded and burnout can then occur—setting an upper limit for the flux rate of the spray cooling process. But also note that once the surface temperature exceeds the Leidenfrost temperature, the heat transfer effectiveness remains nearly constant up to very high temperatures (1250 K in Pedersen's data).

Figure 4:
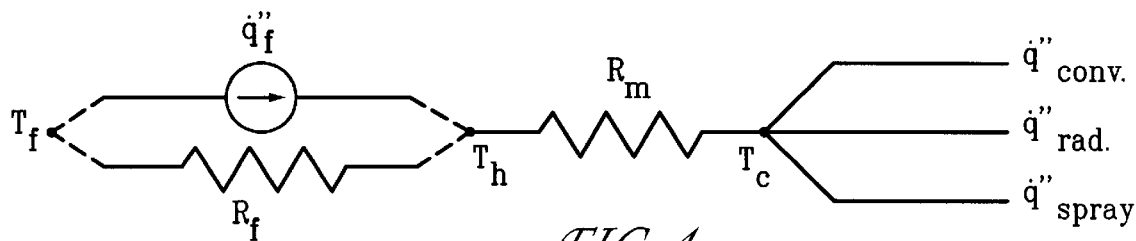
FIG. 4 is a schematic illustration of an electrical circuit analog of a dilute spray cooling model in which the Leidenfrost effect occurs.

A model of one-dimensional heat flow through a mandrel with spray cooling in steady state is presented in FIG. 4 as an electrical circuit analog. The flame is modeled as either imposing a constant heat flux or as having a constant thermal conductance. These two conditions were chosen to bracket the behavior of a real flame. The mandrel is modeled with a simple steady conductance. Heat extraction from the cold-side surface of the mandrel is modeled by three terms. A strong, turbulent gas flow is assumed to accompany the spray, moving at a free stream velocity of 30 m/s over the mandrel face. The gas is taken to be air at room temperature. Gray-body radiation is assumed to occur from the face into the surroundings, also at room temperature. The emissivity of the molybdenum mandrel is taken to be 0.1.

The spray is modeled as being dilute, which in this sense means that the droplets are separated sufficiently in space and time that the behavior of the composite flux is given by the superposition of individual droplet results. Given that the droplet effectiveness is essentially independent of diameter, the heat flux which may be extracted by the spray is solely a function of the mass flux rate of droplets to the mandrel surface (at constant spray velocity). Room temperature water was taken to be the spray fluid used, and the heat transfer effectiveness was modeled by a piece wise linear approximation of FIG. 3, with a low temperature effectiveness of unity and a super-Leidenfrost effectiveness of 0.1. The expression used for each of the cooling terms is given below:

$$\dot{q}''_{conv.} = \frac{k_{air}}{D} 0.036 \, Pr^{1/3}(Re^{0.8} - 23{,}200)(T_c - T_\infty) \qquad (1)$$

Where: $k_{air}$=thermal conductivity of air; D=mandrel diameter; Pr=Prandtl number; Re=Reynolds number; $T_c$=cold side temperature; $T_\infty$=Room temperature; $\epsilon_{moly}$= emissivity; σ=Stefan-Boltzmann constant; $\eta(T_c)$= effectiveness; $h(T_c)$=enthalpy per unit mass of water vapor at the cold side temperature; $h(T_\infty)$=enthalpy per unit mass of liquid water at room temperature; m" is mass flow rate of spray per unit area; and q" is heat flow rate per unit area.

Figure 5:
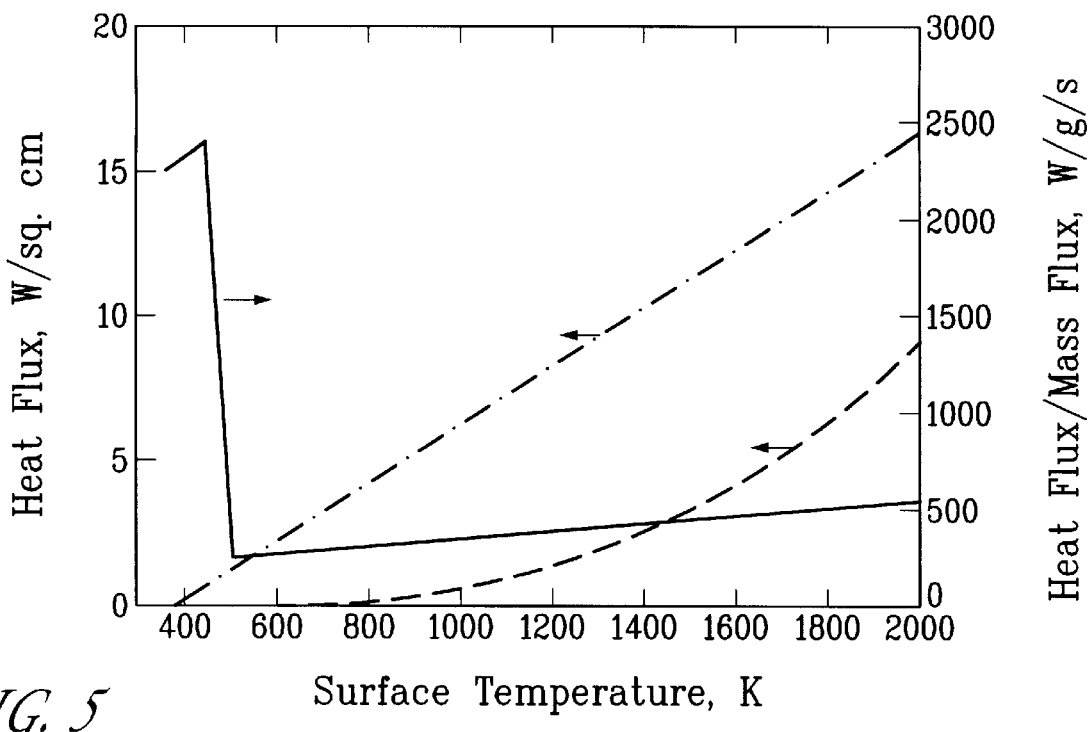
FIG. 5 is a graph showing the relative contributions of radiation (dashed line), gas convection (dot-dashed line), and spray cooling (solid line) to the overall heat extracted from the deposition surface of a mandrel in CVD-like conditions.

FIG. 5 shows the contributions of each of the three terms to the total heat extraction from the surface. Under the conditions of interest here (m" of order 1 $gs^{-1}cm^{-2}$, $T_c$<2000 K) it is apparent that neither gas convection nor radiation plays a significant role in the heat extraction (the horizontal arrows in FIG. 5 indicate the appropriate scale to use). Accordingly, although retained in the analysis, no additional effort need be made to provide more realistic gas convection or radiation models here.

Figure 6:
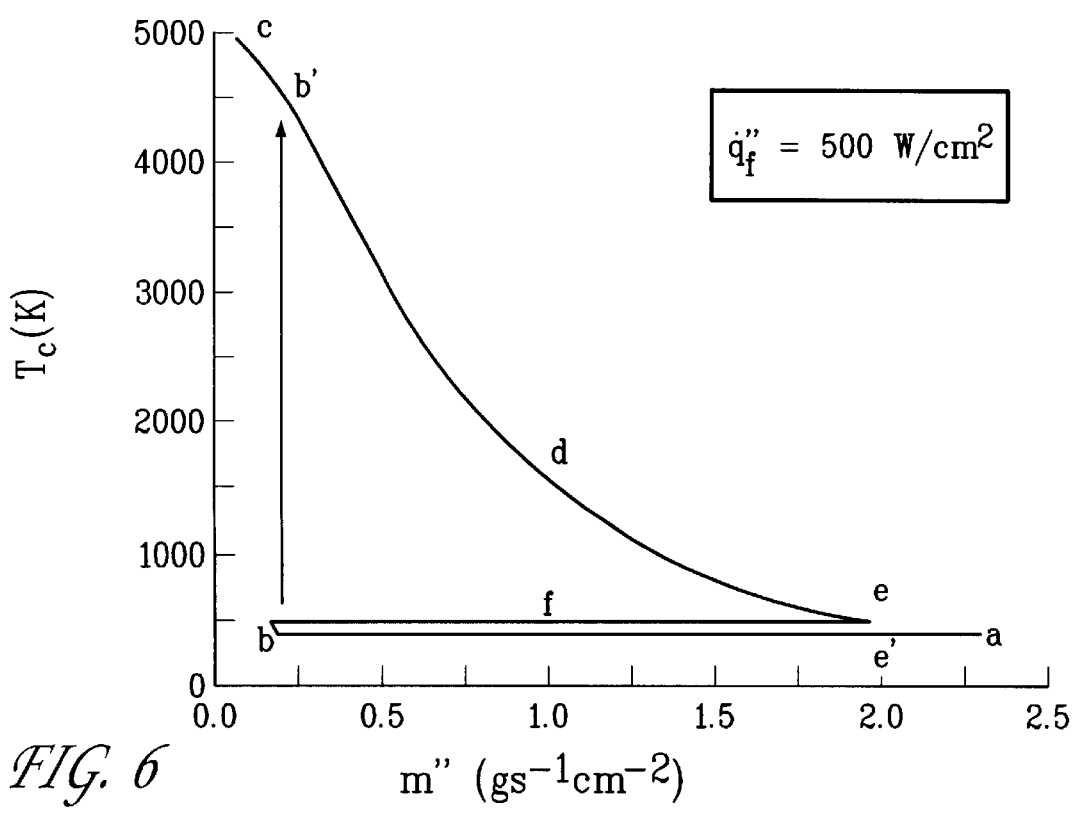
FIG. 6 is a graph of the theoretical solution of a dilute spray cooling model for a fixed heat flux flame source.

FIG. 6 illustrates the results of the model, showing the cold-side surface temperature of the mandrel as a function of mass flux rate of spray for a case with a constant heat flux imposed by the flame. Point a corresponds to isothermal spray cooling with excess capacity, but not so much as to cause burnout. Decreasing the spray flux from this point, the surface remains near the saturation temperature until it becomes starved, that is, until all of the coolant would have evaporated leaving a dry surface (point b). If the spray flux is further decreased, the constant heat flux boundary condition can only be satisfied by a jump in the surface temperature to very high values such that the imposed heat flux is balanced by the combination of droplets, gas convection, and radiation. Denoted b' on the diagram, this point corresponds to a high temperature solution of the energy equation for the same mass flux conditions as point b. The difference between the sprays at points b and b' is that at b the droplets have an effectiveness near unity since they are below the Leidenfrost point, whereas at b' the droplets have an effectiveness of 0.1 since they see super-Leidenfrost conditions (see FIG. 2). Decreasing the spray flux further, progressively higher surface temperatures are required to satisfy the heat balance as illustrated by c on the diagram.

If from point c we now begin to increase the flux rate of spray, we find that the surface temperature decreases in a monotonic fashion along the curve denoted by d. No transition occurs at point b' since the surface temperature is too high to achieve the droplet effectiveness of point b. This monotonic decline provides the key to providing controlled heat transfer for high-temperature, high-flux processes like flame CVD. It shows that the cold side temperature of the mandrel may be directly controlled by varying that flux rate of spray to the surface. Since the high-temperature deposition-side surface temperature differs from this cold side by a constant (for fixed heat flux), the desired deposition-side surface temperature may be imposed and controlled in real time by adjustment of the spray flux. Also note that if the heat flux into the mandrel is not spatially or temporally uniform, the deposition-side surface temperature may still be made uniform by spatially or temporally tailoring the spray flux to the cold-side surface of the mandrel and that this may be accomplished in real time.

Continuing along path d of FIG. 6, the surface temperature will continue to decrease monotonically with an increase in spray flux until it approaches the Leidenfrost temperature (point e). In the vicinity of this point, any additional spray flux will cause a decrease in surface temperature which, in turn, causes an increase in droplet heat transfer effectiveness, and so on. The result is that the temperature will drop precipitously from e to e' as the spray jumps back to sub-Leidenfrost conditions. Further changes in the spray flux will be along the a–b isotherm previously discussed. (Note that the branch of the solution denoted by f corresponds to a balance of the energy equation for surface temperatures in the transition region between sub- and super-Leidenfrost conditions. While a valid solution of the energy equation, it is inherently unstable and therefore not employed here.)

Although the results depicted in FIG. 6 are useful for exposing the non-linearities of spray cooling, they are of little value for determining the control characteristics of the super-Leidenfrost approach since the assumption that the flame acts as a constant heat source is unrealistic. For this reason two other flame conditions were considered: the radiative flame and the resistive flame. The radiative flame is one which transfers heat to the mandrel in proportion to the difference of temperatures taken to the fourth power. The resistive flame is one which transfers heat in proportion to the temperature difference (first power). The motivation behind considering these two conditions is that while neither represents the heat flux from a real flame (which is unknown for these conditions) they do represent bracketing cases for the heat flux. The flame under consideration is a rich, premixed acetylene/oxygen/hydrogen flame that is highly luminous. As such, in addition to a strong convective heat transfer component, a radiative component of heat transfer also exists. This would lead us to expect a heat flux which progresses more rapidly with temperature difference than the resistive flame but more slowly than the purely radiative. Accordingly, these two models serve to bracket the actual flame behavior.

Calculations were performed using these two flame models. However, it was found that in the temperature region of interest, the radiative flame solution was essentially identical to the constant heat flux solution already investigated—diverging only at very high temperatures. As such, the two limiting solutions are taken to be the fixed-flux and resistive flames.

Figure 7A:
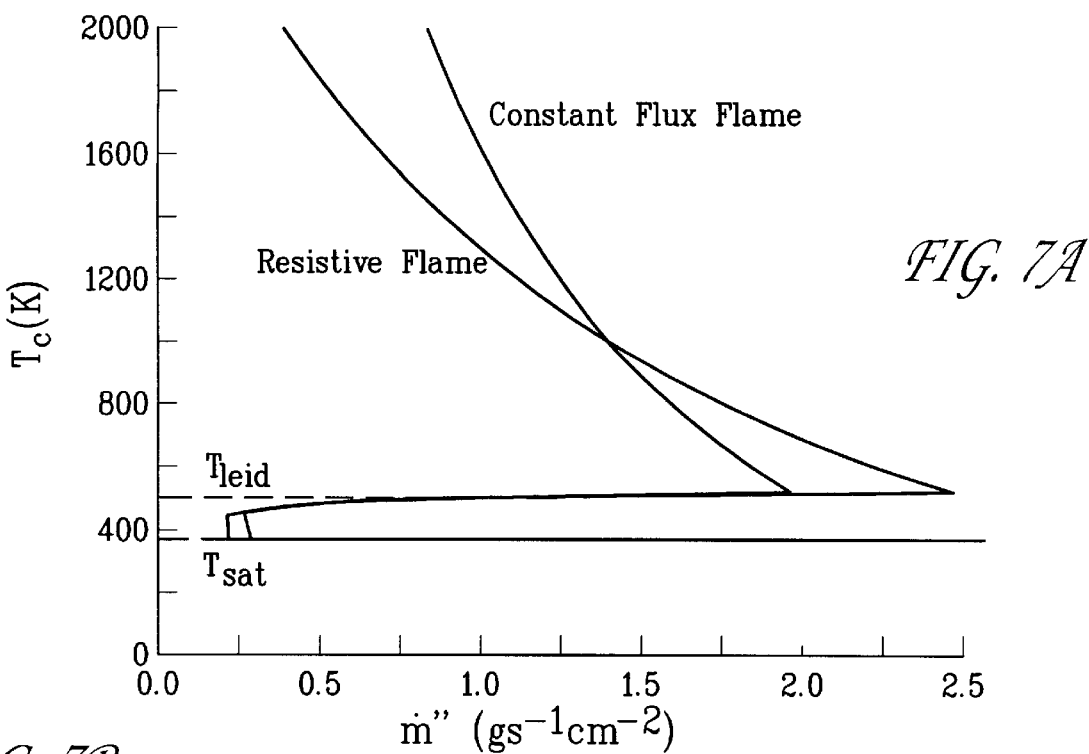
FIG. 7A graphically describes constant flux and resistive flame solutions for dilute spray cooling.

FIG. 7A presents a comparison of the cooling curves for the two flame conditions with the fixed flux chosen to be 500 W/cm$^2$, a flame temperature of 3000 K and a flame conductance chosen so that the two solutions intersect at a cold-side mandrel temperature of 1000 K (i.e., at 1000 K the resistive flame also provides a heat flux of 500 W/cm$^2$). These curves show that the expected relationship between the surface temperature and mass flux rate of spray is well behaved as long as the temperature is maintained above the Leidenfrost point and that good control of the surface temperature can be maintained simply by varying the mass flux rate of spray over a range of values.

Figure 7B:
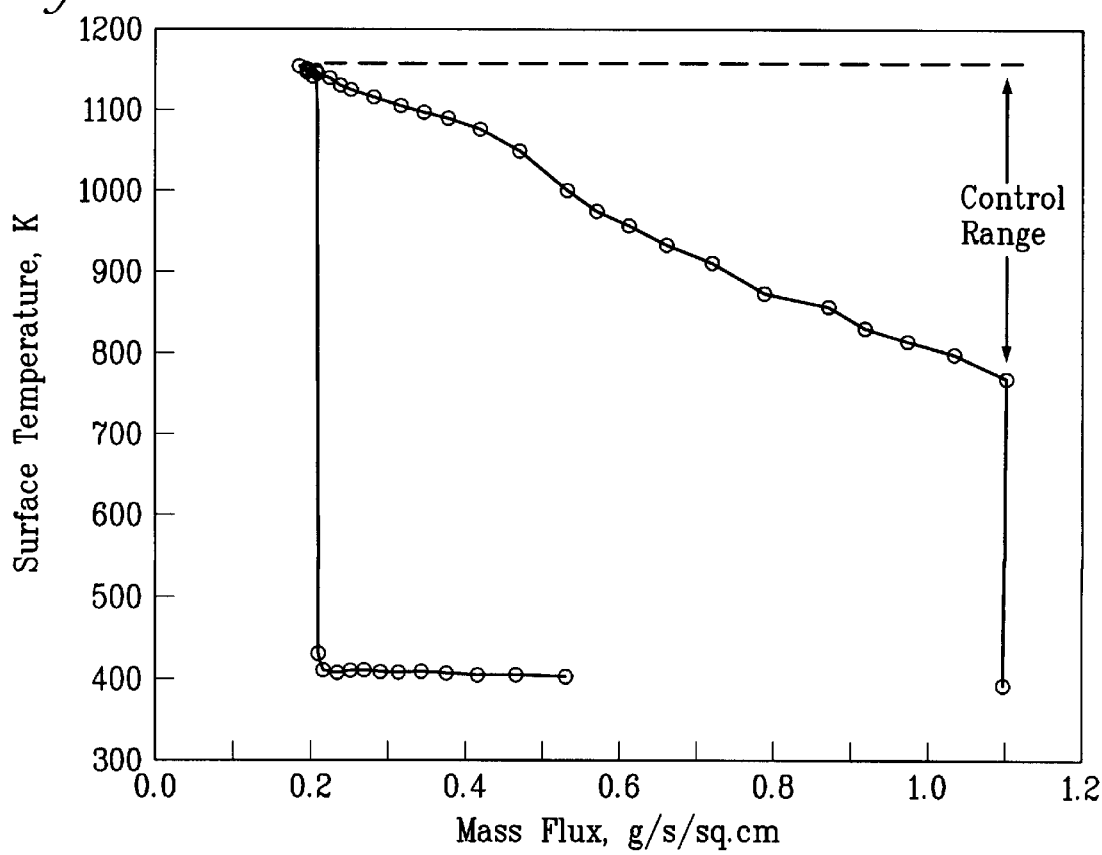
FIG. 7B presents experimental data relating the manner in which selection of mass flux rate can be used to control surface temperature.

Data reflecting the experimental verification of the existence and controllability of the super-Leidenfrost branch of the spray cooling solution are presented in FIG. 7B. (For a description of the technical details of the fixture employed to gather this data, see "Super-Leidenfrost Spray Cooling: A Solution to the Problem of Controlled High-Temperature, High-Flux Heat Extraction," ILASS-95, Troy, Mich., May, 1995, the contents of which are incorporated herein by reference.)

Figure 8:
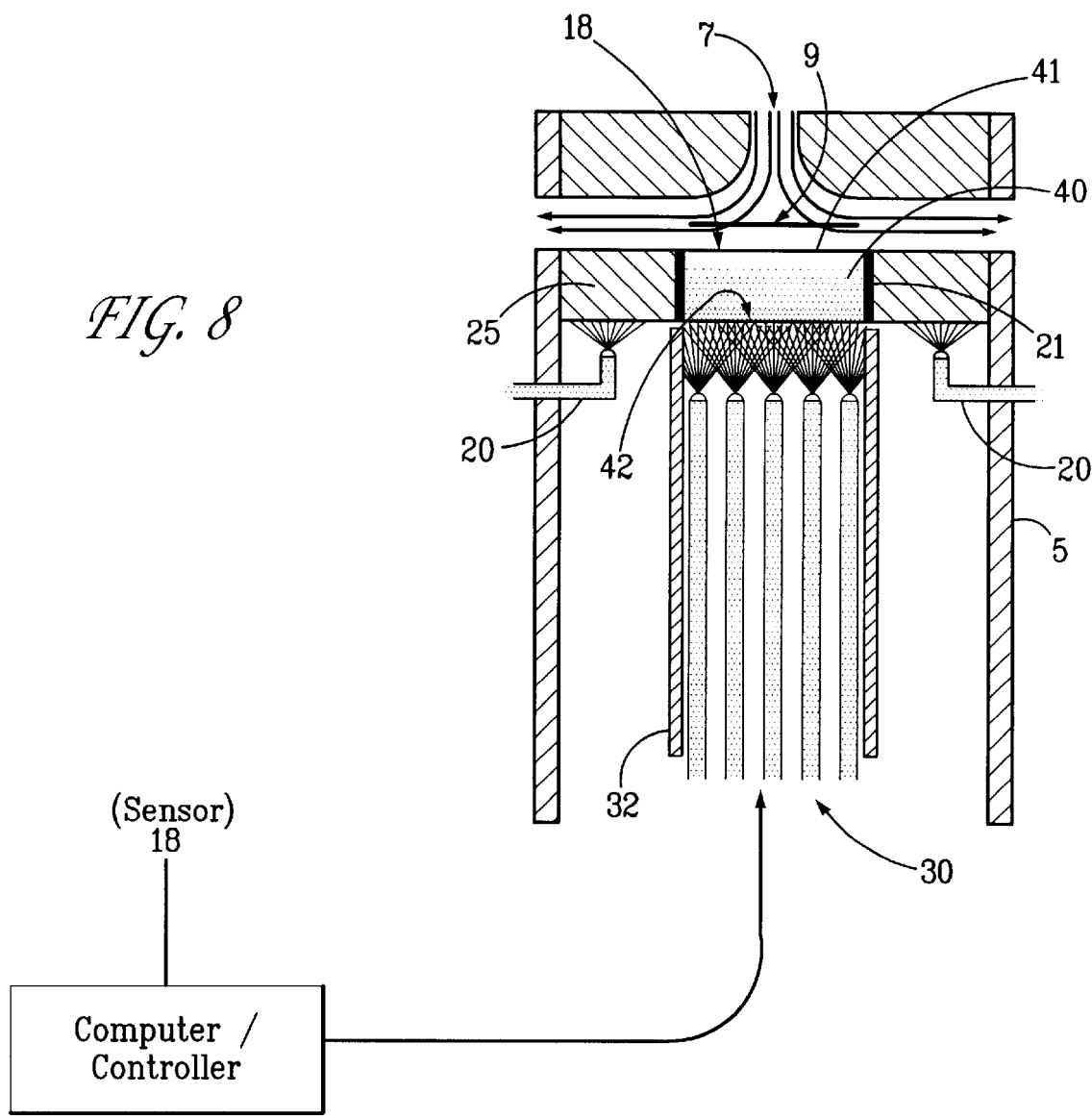
FIG. 8 schematically illustrates a second embodiment of an apparatus that utilizes spray cooling, in which the characteristics of a super-Leidenfrost spray cooling regime are used to advantage.
Figure 9:
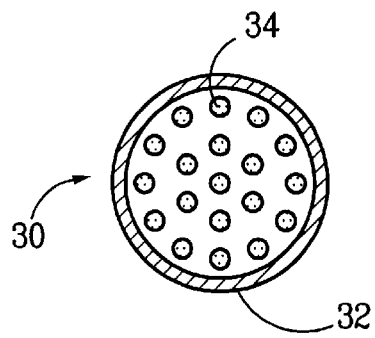
FIG. 9 is a schematic plan view of an array of fixed position nozzles employed in the embodiment of FIG. 8.

FIGS. 8 and 9 schematically illustrate an apparatus for cooling a high heat flux surface utilizing super-Leidenfrost spray cooling. As with the embodiment of FIG. 3, reactants 7 are driven in a flame 9 to a deposition surface 41. In this embodiment, the deposition surface 41 is the hot side of a molybdenum disk 40. A number of sensors 18 are provided to gather data concerning the thermal state of the disk. These sensors may be of any known type suitable for use in this environment, and can be directly attached to the disk 40. Alternatively, the sensors may be provided in the form of one or more optical pyrometers, and not be directly attached to the disk. The disk 40 is offset from housing 5 by a thermal break 21 and a deck 25. The deck 25 is cooled by spray from a plurality of outer cooling nozzles 20. On the cool side 42 of the disk 40 is arrayed a bundle of fixed position nozzles 30. The bundle consists of a number of individually controllable nozzles 34 contained within a cylindrical jacket 32.

In operation, the temperature of the cool side of the disk is permitted to rise to a super-Leidenfrost state, at which point the flow rate of coolant from the nozzles is selected to provide the desired degree of heat flux to compensate for the level of heat flux at the hot side (deposition surface) 41. As noted, the molybdenum disk 40 is instrumented with a plurality of sensors 40, to provide a process control computer with real-time information concerning the thermal state and profile of the disk. The process computer (which is associated with a standard controller for controlling the mass flow rate of coolant through each of the nozzles) can then utilize an algorithm (such as a conventional proportional-integral-derivative feedback loop) or a look-up table to ascertain and effect the appropriate mass flow rate of spray necessary to put, keep or return the temperature of the hot side of the disk 40 to some known desired level (which also may be stored in the memory of the computer). By varying the droplet flux rate form nozzle to nozzle 34 within the bundle 30, a spatially varying thermal profile may be provided to the hot side of the disk 40. An additional level of control may be provided by selectively altering the atomization characteristics of the nozzles, as by using air-assisted atomizers.

Bibliography

1. M. Pais, D. Tilton, L. Chow, and E. Mahefkey, High-Heat-Flux, Low-Superheat Evaporative Spray Cooling, AIAA Paper # AIAA-89-0241, 1989.
2. D. E. Tilton, Spray Cooling, Ph.D. Dissertation, University of Kentucky, 1989.
3. K. J. Choi and S. C. Yao, Mechanisms of Film Boiling Heat Transfer of Normally Impacting Spray, *Int. J Heat Mass Transfer*, Vol. 30, pp. 311–318, 1987.
4. R. E. Gaugler, Experimental Investigation of Spray Cooling of High Temperature Surfaces, Ph.D. Dissertation, Carnegie Institute of Technology, 1966.
5. J. C. Corman, Water Cooling of a Moving High Temperature Metal Strip, Ph.D. Dissertation, Carnegie Institute of Technology, 1966.
6. V. A. Shamamian and J. D. Ladouceur, Thermal Management Considerations Involved in the Design of a Substrate Mount for Large Area CVD Diamond Combustion Deposition, Naval Research Laboratory, unpublished report.
7. J. Naber, Droplet Impingement on a Heated Surface, Ph.D. Dissertation, University of Wisconsin, Madison, 1992.
8. C. O. Pedersen, The Dynamics and Heat Transfer Characteristics of Water Droplets Impinging Upon a Heated Surface, Ph.D. Dissertation, Carnegie Institute of Technology, 1967.
9. C. J. Hoogendoorn and R. den Hond, Leidenfrost Temperature and Heat Transfer Coefficients for Water Sprays Impinging on a Hot Surface, Proceedings of the Fifth International Conference on Heat Transfer, Tokyo, September, 1974.

What is claimed is:

1. A method of spray cooling a mandrel having a hot surface and a peripheral surface extending from the hot surface, comprising the steps of:

spraying coolant from a plurality of nozzles onto the peripheral surface of the mandrel so as to establish an isothermal cooling region on the mandrel, said isothermal cooling region having a boundary; and axially moving the nozzles with respect to the mandrel so as to vary the location of the isothermal boundary so as to vary the thermal resistivity of the mandrel.

2. The method of claim 1, further comprising the steps of:

acquiring the thermal information regarding the mandrel via a sensor;

feeding information concerning the thermal state of the mandrel obtained from the sensor to a computer; and adjusting the position of the nozzles in dependence upon the temperature of the mandrel.

3. The method of claim 1, wherein the location of the mandrel is fixed and the nozzles are moved along the peripheral surface of the mandrel.

4. The method of claim 1, wherein the location of the nozzles is fixed and the mandrel is moved along its axial extent.

5. The method of claim 1, further comprising the step of providing an additional spray of coolant onto a cool side of the mandrel.

6. The method of claim 1, further comprising the step of isolating the coolant sprays provided by the nozzles with at least one splash guard.

7. The method of claim 1, further comprising the steps of:
ascertaining the thermal state of the mandrel;
comparing the thermal state of the mandrel to a desired thermal state;
relating the actual thermal state of the mandrel and the desired thermal state of the mandrel to a desired position of an isothermal boundary on the peripheral surface of the mandrel; and
moving the position of the spray that is directed against the peripheral surface of the mandrel so as to provide the desired isothermal boundary.

8. The method of claim 1, further comprising the step of directing a flame against a surface of the mandrel.

9. The method of claim 1, further comprising the step of directing a jet comprising $C_2H_2/O_2/H_2$ against the mandrel.

10. The method of claim 7, further comprising the step of forming diamond on a surface of the mandrel.

11. The method of claim 7, further comprising the step of varying the flow rate of coolant through the nozzles.

12. The method of claim 1, further comprising the step of contouring the mandrel so as to provide a desired spatial profile of the temperature on the hot side of the mandrel where deposition occurs.

13. The method of claim 1, further comprising the step of varying the atomization characteristics of at least one of the nozzles.

14. An apparatus for using spray cooling to control the temperature of the hot surface of a solid, comprising:
a mandrel having a hot side, wherein the hot side is being heated, a cool side and a peripheral side extending between the hot side and the cool side;
a set of spray nozzles facing the peripheral side of the mandrel to provide a spatially varying thermal profile along the peripheral side of the mandrel, said set of spray nozzles being movable with respect to the first and second sides of the mandrel, wherein a flow rate of a coolant through said set of spray nozzles is variable and wherein the flow rate of coolant through at least one of the spray nozzles is independently controllable;
an actuator for moving the spray nozzles with respect to the mandrel to alter the thermal resistance of the mandrel; and
a sensor for acquiring thermal information about the mandrel.

15. An apparatus as set forth in claim 14, further comprising a source of coolant.

16. An apparatus as set forth in claim 14, wherein the sensor is an optical pyrometer.

17. An apparatus as set forth in claim 14, further comprising at least one splash guard to control the spray.

18. An apparatus as set forth in claim 14, further comprising a housing to contain the mandrel.

19. An apparatus as set forth in claim 14, wherein the hot side of the mandrel is surrounded by a deck spacing the solid body from the housing of the apparatus.

20. An apparatus as set forth in claim 19, wherein the hot side of the mandrel is spaced from the deck by a thermal break.

21. An apparatus as set forth in claim 19, further comprising means for directing coolant to the deck adjacent the mandrel.

22. An apparatus as set forth in claim 14, wherein atomization characteristics of at least on of the nozzles can be varied.

23. A chemical vapor deposition apparatus for forming diamond, comprising:
a housing;
a source of chemical reactants;
a mandrel located within the housing, said mandrel having two opposed faces and a peripheral face connecting the first and the second faces to each other, said first face serving as a vapor deposition surface;
a plurality of spray nozzles for applying coolant to the peripheral surface of the mandrel, said spray nozzles being axially displaceable with respect to the mandrel, wherein the spray delivered by the spray nozzles establishes an isothermal cooling surface along the mandrel the boundary of which can be varied by axially moving the spray nozzles.

24. A chemical vapor deposition apparatus for forming diamond as set forth in claim 23, wherein the mandrel is cylindrical.

25. An apparatus for spray cooling a solid body comprising:
a solid body having a plurality of exterior surfaces, including a first surface that is hot in use and a second surface that is less hot in use, said solid body having one or more sensors to provide information regarding the thermal state of at least a portion of the solid body; and
a plurality of spray nozzles for spraying coolant onto the second surface of the solid body, at least some of the spray nozzles being independently controllable so that the mass flow rate of coolant through one of the nozzles can be varied independently of the mass flow rate of coolant through another of the nozzles.

26. An apparatus as set forth in claim 25, wherein the solid body is in the shape of a disk.

27. An apparatus as set forth in claim 25, wherein a deck is arrayed about the solid body.

28. An apparatus as set forth in claim 27, wherein the deck is separated from the solid body by a thermal break.

29. An apparatus as set forth in claim 27, further comprising means for directing coolant to the deck.

30. An apparatus as set forth in claim 25, wherein the atomization characteristics of at least one of the nozzles is adjustable.

31. A method of controlling the temperature of a side of a disk of material having a cooling side that has a temperature in the super-Leidenfrost range, comprising the steps of:
ascertaining the thermal state of the disk;
comparing the thermal state of the disk to its desired thermal state;
relating the actual thermal state of the disk and the desired thermal state of the disk to a desired mass flow rate of coolant to be applied to the disk in the form of droplets; and
supplying the desired mass flow rate of coolant through a series of spray nozzles to the cooling side.

32. The method of claim 31, wherein the cooling side of the disk is permitted to rise above the Leidenfrost temperature.

33. The method of claim 31, further comprising the step of directing a flame against a surface of the disk.

34. The method of claim 31, further comprising the step of directing a jet comprising $C_2H_2/O_2/H_2$ against the disk.

35. The method of claim 34, further comprising the step of forming diamond on a surface of the disk.

36. The method of claim 31, further comprising the steps of:

ascertaining the thermal state of the disk via a sensor;

feeding information concerning the thermal state of the disk obtained from the sensor to a computer; and using the computer to control the flow rate of coolant through the spray nozzles.

37. The method of claim 31, further comprising the step of isolating the coolant sprays provided by the nozzles with at least one splash guard.

38. The method of claim 31, further comprising the step of spatially varying the flow rate of coolant through the nozzles.

39. The method of claim 31, further comprising the step of varying the atomization characteristics of at least one of the nozzles.

* * * * *